(12) United States Patent
Mestrom et al.

(10) Patent No.: US 9,648,714 B2
(45) Date of Patent: May 9, 2017

(54) FUEL SYSTEM FOR LITHOGRAPHIC APPARATUS, EUV SOURCE, LITHOGRAPHIC APPARATUS AND FUEL FILTERING METHOD

(71) Applicant: ASML Netherlands B.V., Veldhoven (NL)

(72) Inventors: Wilbert Jan Mestrom, Roermond (NL); Gerardus Hubertus Petrus Maria Swinkels, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 72 days.

(21) Appl. No.: 14/388,742

(22) PCT Filed: Feb. 6, 2013

(86) PCT No.: PCT/EP2013/052342
§ 371 (c)(1),
(2) Date: Sep. 26, 2014

(87) PCT Pub. No.: WO2013/143733
PCT Pub. Date: Oct. 3, 2013

(65) Prior Publication Data
US 2015/0070675 A1    Mar. 12, 2015

Related U.S. Application Data

(60) Provisional application No. 61/616,117, filed on Mar. 27, 2012.

(51) Int. Cl.
*H05G 2/00*     (2006.01)
*G03F 7/20*     (2006.01)

(52) U.S. Cl.
CPC ......... *H05G 2/006* (2013.01); *G03F 7/70033* (2013.01); *H05G 2/001* (2013.01);
(Continued)

(58) Field of Classification Search
CPC .... G03F 7/70033; H05G 2/005; H05G 2/001; H05G 2/006; H05G 2/008; Y10T 137/0318; Y10T 137/794
See application file for complete search history.

(56) References Cited

U.S. PATENT DOCUMENTS 4,055,491 A * 10/1977 Porath-Furedi ...... B01D 21/283
                                                            209/5
6,244,738 B1   6/2001 Yasuda et al.
(Continued)

FOREIGN PATENT DOCUMENTS

EP    1 872 952 A1    1/2008
JP    58-151949 A     9/1983
(Continued)

OTHER PUBLICATIONS

English-Language Abstract for Japanese Patent Publication No. 58-151949 A, published Sep. 9, 1983; 1 page.
(Continued)

*Primary Examiner* — Michelle M Iacoletti
(74) *Attorney, Agent, or Firm* — Sterne, Kessler, Goldstein & Fox P.L.L.C.

(57) ABSTRACT

A fuel supply for an EUV radiation source is disclosed. The fuel supply comprises a reservoir (40) for retaining a volume of fuel (42), a nozzle (32), in fluid connection with the reservoir, and configured to direct a stream of fuel along a trajectory towards a plasma formation location, and a fuel contamination control arrangement (44) which separates contamination particles from the fuel. The contamination control arrangement comprises at least one acoustic filter. The acoustic filter may apply an acoustic standing wave to the fuel. Also disclosed is a method of controlling contamination in such a fuel supply.

18 Claims, 5 Drawing Sheets

(52) U.S. Cl.
CPC ............. *H05G 2/008* (2013.01); *H05G 2/005* (2013.01); *Y10T 137/0318* (2015.04); *Y10T 137/794* (2015.04)

(56) References Cited

U.S. PATENT DOCUMENTS

| | | | |
|---|---|---|---|
| 2004/0071266 A1* | 4/2004 | Orsini | H05G 2/001 378/119 |
| 2004/0226437 A1* | 11/2004 | Stenersen | B01D 19/0078 95/29 |
| 2005/0077655 A1* | 4/2005 | Ikeda | B28B 1/08 264/442 |
| 2006/0192154 A1 | 8/2006 | Algots et al. | |
| 2006/0193997 A1 | 8/2006 | Bykanov | |
| 2006/0255298 A1 | 11/2006 | Bykanov et al. | |
| 2008/0014589 A1 | 1/2008 | Link et al. | |
| 2010/0039631 A1 | 2/2010 | Loopstra et al. | |
| 2010/0097593 A1 | 4/2010 | Murakami | |
| 2010/0200776 A1 | 8/2010 | Yabu et al. | |
| 2011/0154890 A1 | 6/2011 | Holm et al. | |
| 2011/0247456 A1 | 10/2011 | Rundquist et al. | |

FOREIGN PATENT DOCUMENTS

| | | | |
|---|---|---|---|
| JP | 2007-059373 | A | 3/2007 |
| JP | 2008-532293 | A | 8/2008 |
| JP | 2010-045357 | A | 2/2010 |
| JP | 2010-199560 | A | 9/2010 |

OTHER PUBLICATIONS

English-Languae Abstract for Japanese Patent Publication No. 2007-059373 A, published Mar. 8, 2007; 1 page.

International Search Report directed to related International Patent Application No. PCT/EP2013/052342, mailed May 23, 2013; 5 pages.

International Preliminary Report on Patentability and Written Opinion of the International Searching Authority directed to related International Patent Application No. PCT/EP2013/052342, issued Oct. 1, 2014; 7 pages.

Hawkes et al., "Single half-wavelength ultrasonic particle filter: Predictions of the transfer matrix multilayer resonator model and experimental filtration results," Journal of Acoustical Society of America, vol. 111, No. 3, Mar. 2002; pp. 1259-1266.

Ohta et al., "Behavior of Solid Particles in Liquid Under Ultrasound Irradiation," Progress in Multiphase flow Research 2, 2007; pp. 101-107.

* cited by examiner

FUEL SYSTEM FOR LITHOGRAPHIC APPARATUS, EUV SOURCE, LITHOGRAPHIC APPARATUS AND FUEL FILTERING METHOD

CROSS REFERENCE TO RELATED APPLICATIONS

This application claims the benefit of U.S. provisional application 61/616,117, filed on Mar. 27, 2012 which is incorporated herein in its entirety by reference

FIELD

The present invention relates to a fuel supply for a radiation source in a lithographic apparatus and to a method for controlling contamination in such a fuel supply. The present invention more generally relates to an arrangement for generating a stream of fluid. The present invention further relates to an EUV radiation source comprising the fuel supply according to the invention and to a lithographic apparatus comprising such an EUV radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

A proposed LPP radiation source generates a continuous stream of fuel droplets. The radiation source comprises a nozzle for directing fuel droplets toward a plasma formation location. The droplets need to be directed to the plasma formation location with a high degree of accuracy in order to ensure that a laser beam may be directed toward and into contact with the droplets. In order to achieve this, fuel should pass through the nozzle without encountering any unexpected or unintentional obstructions or restrictions. Such obstructions or restrictions may result from contamination in the fuel being deposited on an internal surface of the nozzle. The contamination can result in a stream of droplets directed by the nozzle not having one or more required properties, for example a desired trajectory or a desired droplet size, shape or velocity. As a result, this can lead to the radiation source as a whole not functioning as intended, for example not being able to generate radiation, or not being able to generate radiation of the required intensity or for a required duration.

Although problems have been described in relation to nozzles used in LPP radiation sources, the same or similar problems may be encountered in conjunction with nozzles used in other fluid (e.g., liquid) stream generators (droplet or continuous), for example nozzles used in ink-jet printing or the like. Also, the problems are not restricted to a stream comprising droplets—the same or similar problems may be encountered when a continuous stream is to be generated.

SUMMARY

The invention in a first aspect provides a fuel supply for a radiation source comprising: a reservoir configured to retain a volume of fuel; a nozzle, in fluid connection with the reservoir, and configured to direct a stream of fuel along a trajectory towards a plasma formation location; and a fuel contamination control arrangement operable to separate contamination particles from said fuel, the contamination control arrangement comprising at least one acoustic filter.

The invention in a further aspect provides a method of controlling contamination in a fuel supply for a radiation source comprising: generating an acoustic standing wave in a portion of the fuel comprised in said fuel supply, such that contamination particles in said portion of the fuel align with maxima and/or minima of said standing wave; and directing said aligned contamination particles away from a nozzle of said fuel supply.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

Figure 3:
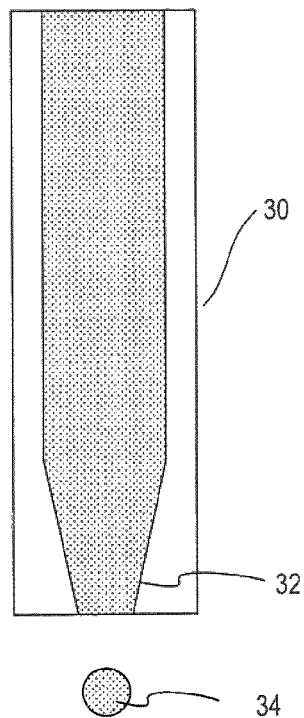
Figure 4:
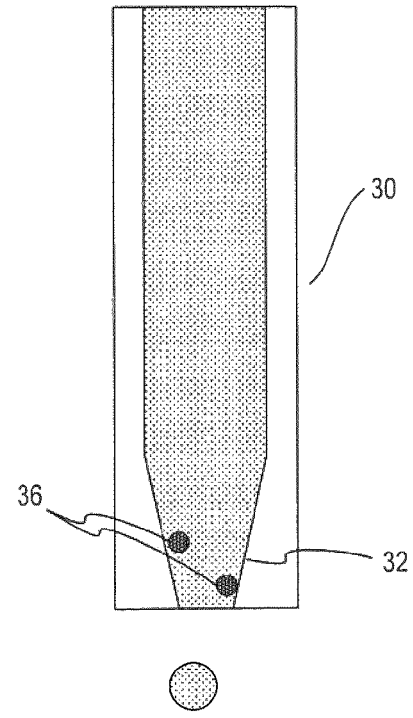
Figure 5:
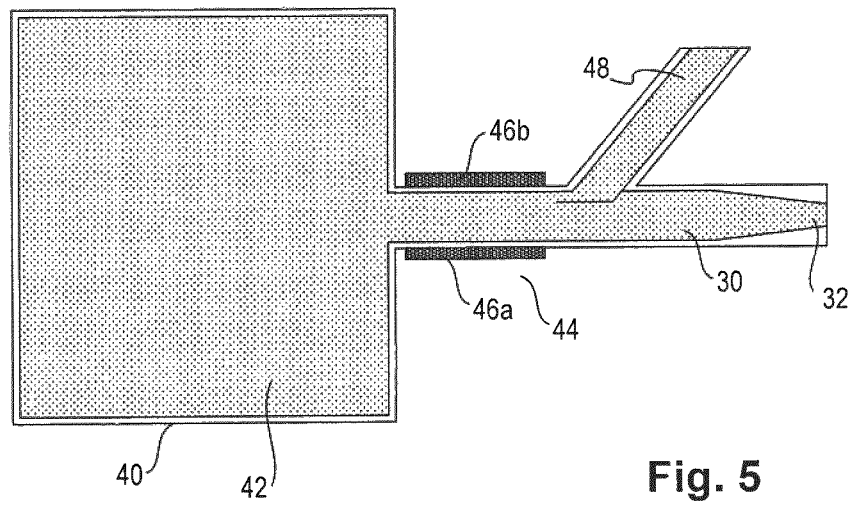
Figure 6:
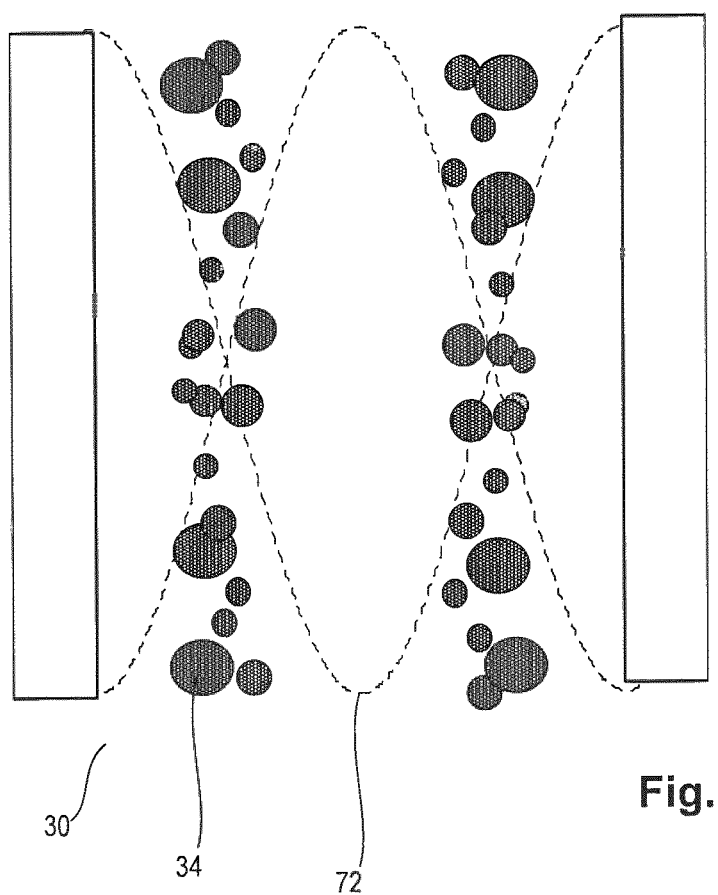
Figure 7:
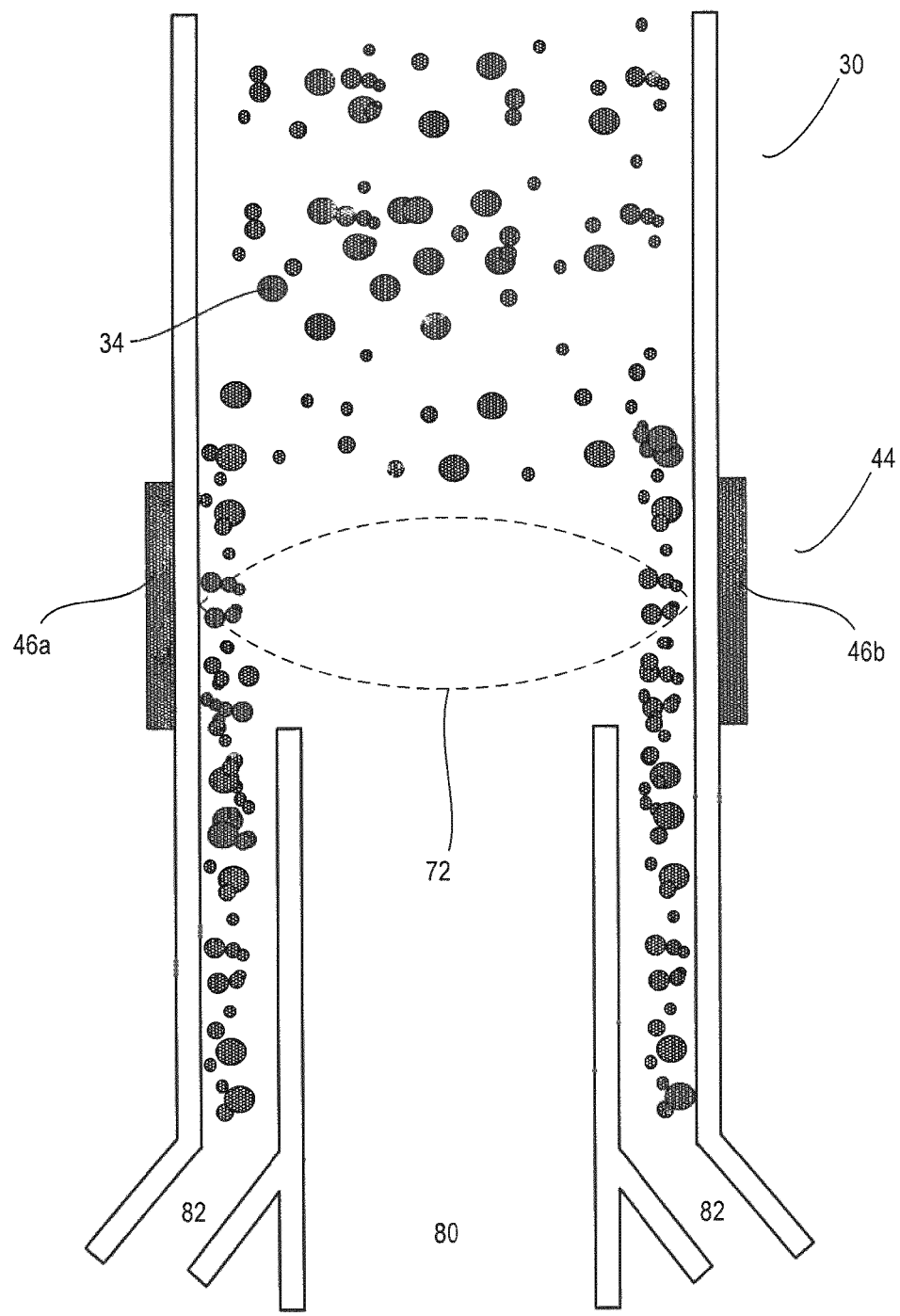
Figure 8:
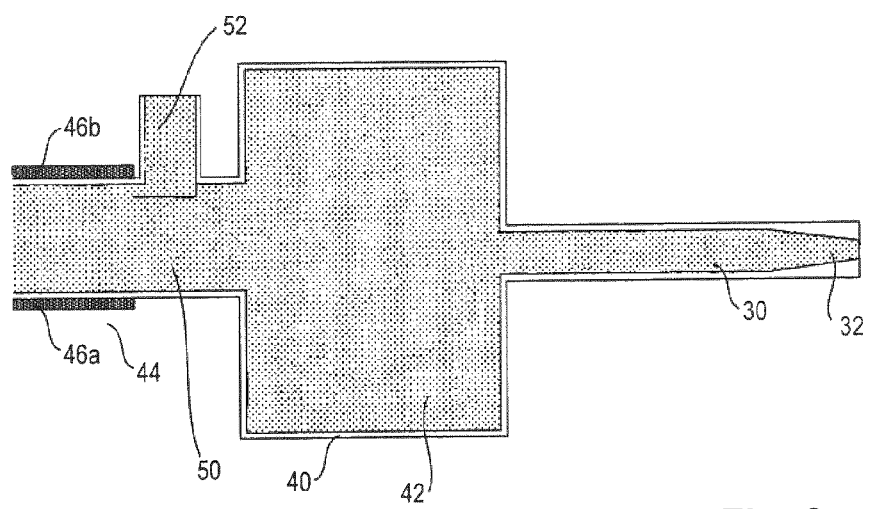

FIG. 3 schematically depicts a nozzle of a radiation source configured to direct a stream of fuel droplets along a trajectory towards a plasma formation location;

FIG. 4 schematically depicts contamination deposition on an internal surface of the nozzle of FIG. 3, and an effect on a trajectory of droplets leaving the nozzle;

FIG. 5 schematically depicts a first embodiment of a fluid stream generator comprising a fluid contamination control arrangement, in accordance with an embodiment of the present invention;

FIG. 6 illustrates the principle of acoustic filtering using standing waves;

FIG. 7 shows a practical application of the effect illustrated in FIG. 6, according to an embodiment of the invention; and FIG. 8 schematically depicts a second embodiment of a fluid stream generator comprising a fluid contamination control arrangement, in accordance with an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

Figure 1:
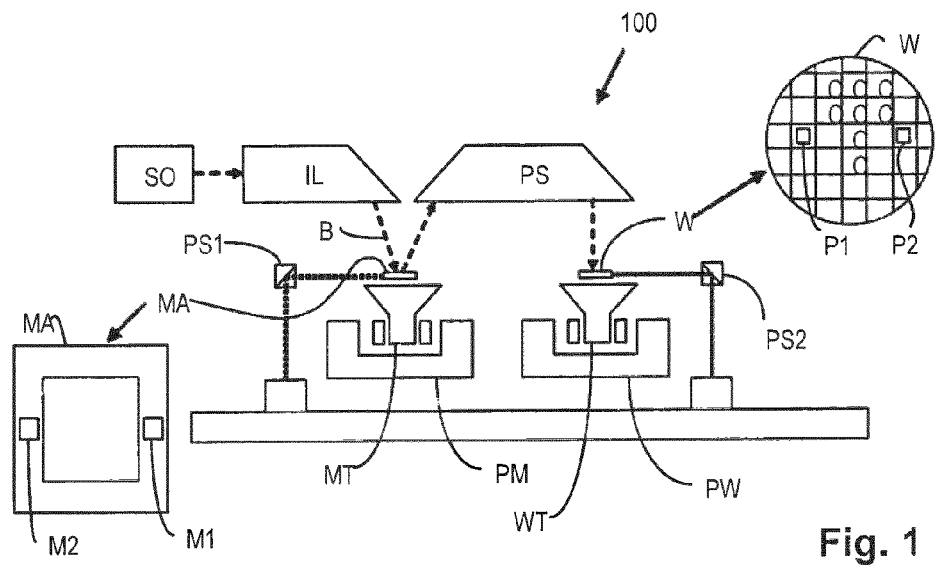
FIG. 1 depicts schematically a lithographic apparatus having reflective projection optics.

FIG. 1 schematically depicts a lithographic apparatus 100 including a source collector module SO according to one embodiment of the invention. The apparatus comprises:

an illumination system (illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Figure 2:
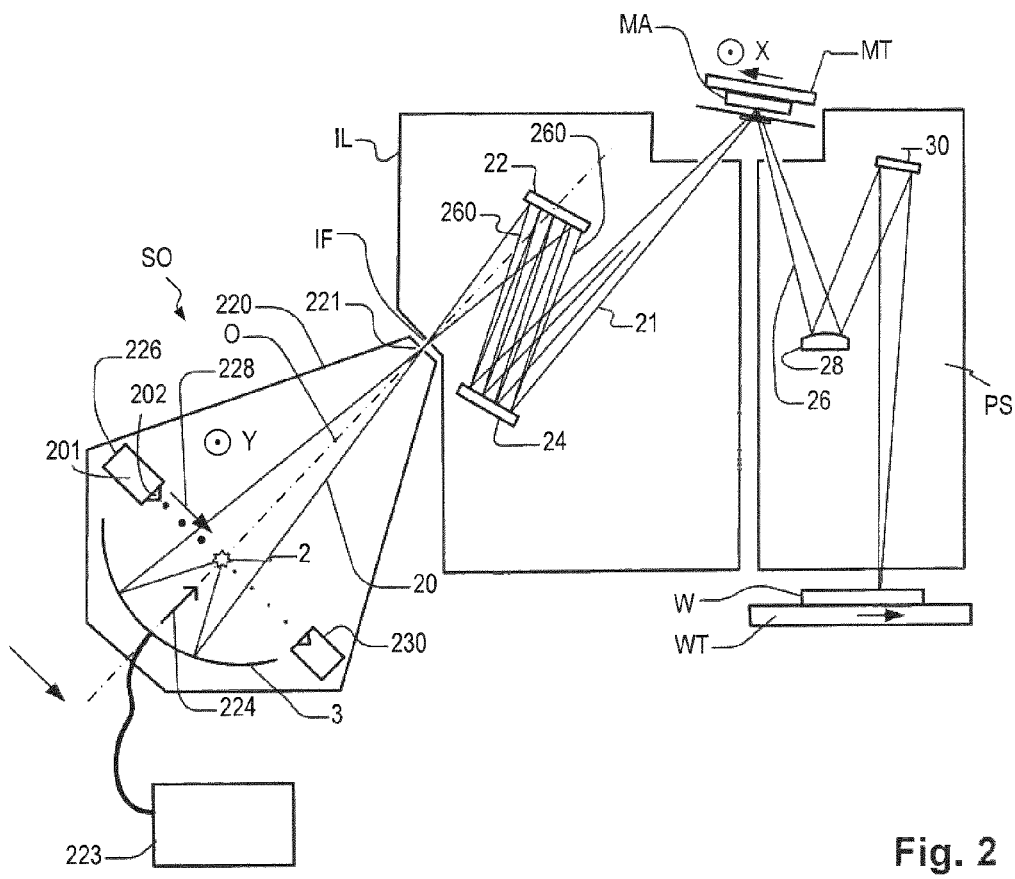
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. The systems IL and PS are likewise contained within vacuum environments of their own. An EUV radiation emitting plasma 2 may be formed by a laser produced LPP plasma source. The function of source collector module SO is to deliver EUV radiation beam 20 from the plasma 2 such that it is focused in a virtual source point. The virtual source point is commonly referred to as the intermediate focus (IF), and the source collector module is arranged such that the intermediate focus IF is located at or near an aperture 221 in the enclosing structure 220. The virtual source point IF is an image of the radiation emitting plasma 2.

From the aperture 221 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA. Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the wafer stage or substrate table WT. To expose a target portion C on substrate W, pulses of radiation are generated on substrate table WT and masked table MT perform synchronized movements 266, 268 to scan the pattern on patterning device MA through the slit of illumination.

Each system IL and PS is arranged within its own vacuum or near-vacuum environment, defined by enclosing structures similar to enclosing structure 220. More elements than shown may generally be present in illumination system IL and projection system PS. Further, there may be more mirrors present than those shown in the Figures. For example there may be one to six additional reflective elements present in the illumination system IL and/or the projection system PS, besides those shown in FIG. 2.

Considering source collector module SO in more detail, laser energy source comprising laser 223 is arranged to deposit laser energy 224 into a fuel, such as xenon (Xe), tin (Sn) or lithium (Li), creating the highly ionized plasma 2 with electron temperatures of several 10's of eV. Higher energy EUV radiation may be generated with other fuel materials, for example Tb and Gd. The energetic radiation generated during de-excitation and recombination of these ions is emitted from the plasma, collected by a near-normal incidence collector 3 and focused on the aperture 221. The plasma 2 and the aperture 221 are located at first and second focal points of collector CO, respectively.

Although the collector 3 shown in FIG. 2 is a single curved mirror, the collector may take other forms. For example, the collector may be a Schwarzschild collector having two radiation collecting surfaces. In an embodiment, the collector may be a grazing incidence collector that comprises a plurality of substantially cylindrical reflectors nested within one another. The grazing incidence collector may be suited for use in a DPP source.

To deliver the fuel, which for example is liquid tin, a droplet generator 226 is arranged within the enclosure 220, arranged to fire a high frequency stream 228 of droplets towards the desired location of plasma 2. In operation, laser energy 224 is delivered in a synchronism with the operation of droplet generator 226, to deliver impulses of radiation to turn each fuel droplet into a plasma 2. The frequency of delivery of droplets may be several kilohertz, for example 50 kHz. In practice, laser energy 224 is delivered in at least two pulses: a pre pulse with limited energy is delivered to the droplet before it reaches the plasma location, in order to vaporize the fuel material into a small cloud, and then a main pulse of laser energy 224 is delivered to the cloud at the desired location, to generate the plasma 2. A trap 230 is provided on the opposite side of the enclosing structure 220, to capture fuel that is not, for whatever reason, turned into plasma.

The droplet generator 226 comprises a reservoir 201 that contains the fuel liquid and a nozzle 202. The nozzle 202 is configured to eject droplets of the fuel liquid towards the plasma 2 formation location. The droplets of fuel liquid may be ejected from the nozzle 202 by a combination of pressure within the reservoir 201 and a vibration applied to the nozzle by a piezoelectric actuator (not shown).

In an alternative configuration (not illustrated) the EUV radiation may be generated by causing a partially ionized plasma of an electrical discharge to collapse onto an optical axis (e.g., via the pinch effect). This source may be referred to as a discharge produced plasma (DPP) source. Partial pressures of for example 10 Pa of Xe, Li, Sn vapor or any other suitable gas or vapor may be used to generate the EUV radiation emitting plasma.

As the skilled reader will know, reference axes X, Y and Z may be defined for measuring and describing the geometry and behavior of the apparatus, its various components, and the radiation beams 20, 21, 26. At each part of the apparatus, a local reference frame of X, Y and Z axes may be defined. The Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream 228, while the Y axis is orthogonal to that, pointing out of the page as indicated in FIG. 2. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

Numerous additional components involving operation of the source collector module and the lithographic apparatus as a whole are present in a typical apparatus, though not illustrated here. These include arrangements for reducing or mitigating the effects of contamination within the enclosed vacuum, for example to prevent deposits of fuel material damaging or impairing the performance of collector 3 and other optics. Other features present but not described in detail are all the sensors, controllers and actuators involved in controlling of the various components and sub-systems of the lithographic apparatus.

FIG. 3 schematically depicts a part of the fuel supply or droplet generator 226 as shown in and described with reference to FIG. 2. The part of the droplet generator is shown as comprising a conduit 30 that includes and leads to a nozzle 32 configured to direct a stream of droplets of fuel 34 along a trajectory towards a plasma formation location (not shown).

Stability and/or clogging (i.e., at least partial blocking) of the nozzle 32 are issues that may arise during use of the nozzle 32, as they do for any ink-jet printing application. Clogs will be formed by contamination in the fuel. Clogging of the nozzle 32 may impose a lifetime limit on the nozzle and thus the droplet generator (or at least a time limit at which limit replacement, maintenance, or cleaning is required) and may therefore limit the availability of the radiation source or the lithographic apparatus as a whole.

It is most likely that the nozzle 32 of the droplet generator will have the smallest, or one of the smallest, diameters as compared to other conduits and the like of a fuel flow system forming part of the droplet generator (except, perhaps, for filters present in that system). Since the nozzle 32 will have one of the smallest diameters, it is likely that clogging in the fuel flow system will occur near or at the nozzle 32, and likely within the nozzle 32 that is a restriction in the flow system. It is likely that clogs or the like larger than the nozzle diameter will be filtered out in some way further upstream in the fuel flow system. However, clogs smaller than the nozzle diameter and within the nozzle might result in a change in the effective geometry of the nozzle.

A change in effective geometry may result in a change in the parameters of the generated stream of droplets, for instance the droplet shape or size, or most likely a direction of trajectory of the stream of droplets. In many applications, such parameters will need to meet stringent requirements. In an EUV radiation source in particular, the requirements of the droplet generator will be extremely stringent in terms of the trajectory of the droplet stream. For instance, at a plasma formation location, the location of a droplet may need to be accurate to within a few microns, but at the same time the nozzle 32 itself may need to be located relatively far away from the plasma formation location, for instance by a distance of a few tens of centimeters or so. This results in a direction stability requirement of the trajectory of the stream of droplets of perhaps less than 10 microradians. The overall result is that even very small particulate contamination deposited on an internal surface of the nozzle can change the effective geometry of the nozzle to such an extent to ensure that the direction stability requirement is not met. This might, in turn have a detrimental effect on the operation of the radiation source and thus the lithographic apparatus as a whole, for example in terms of the generation of radiation.

FIG. 4 schematically depicts the same conduit 30, nozzle 32 and droplet stream 34 as shown in and described with reference to FIG. 3. However, in FIG. 4 contamination in the form of particles 36 has become deposited on an internal surface of the nozzle 32. Such deposition has resulted in a change in the effective geometry of the nozzle 32 (as described above), which has resulted, in turn, in a change in trajectory of the stream of droplets 34.

The particles 36 are one example of contamination. The contamination could be particulate in form, or be anything else that might be present within the fuel used to form the droplet stream 34 (e.g., flakes, agglomerations, or the like). The contamination could arise from oxidisation of the fuel. For example, if the fuel is tin, the contamination may be tin oxide particles or the like. Alternatively and/or additionally, the contamination could be particles or the like of materials from apparatus used upstream within the fuel flow system. The contamination could be material from a reservoir configured to retain fuel (or oxides of such material), or a filter present in a fuel flow path.

It is an object of the present invention to prevent the nozzle from being clogged with contamination, thus resulting in a change of effective geometry of the nozzle. One proposed solution would be to use fine or finer filters in the fuel flow system to prevent contamination with an average diameter smaller than the nozzle diameter (i.e., the opening of the nozzle) from reaching the nozzle. However, this may then result in a blockage of the fuel flow system as a whole (i.e., at that filter), which could again result in the need to regularly maintain or repair the droplet generator, causing significant downtime of the radiation source and/or the lithographic apparatus as a whole. The present invention provides an alternative approach to the problems identified above, which does not (or at least is less likely to) result in increasing the chances of blockages being formed within the fuel flow system (which includes the nozzle).

FIG. 5 schematically depicts a fluid stream generator of a radiation source, in accordance with an embodiment of the present invention. The fluid stream generator comprises a reservoir 40 configured to retain a volume of fuel 42 used in the generation of radiation (e.g., liquid tin). The reservoir 40 is in fluid connection with (i.e., able to supply fuel to) the conduit 30 and droplet defining nozzle 32 already shown in and described with reference to FIGS. 3 and 4 above. Referring back to FIG. 5, pressure may be applied to the fuel 42 (e.g., mechanical or fluid pressure) to force ejection of fuel 42 through the nozzle 32.

The fluid stream generator is also provided with a fuel contamination control arrangement 44. The fluid contamination control arrangement comprises an acoustic filter 44 for generating ultrasonic standing waves in the fuel held in the conduit 30. The acoustic filter 44 may comprise either two opposing sound sources or more commonly by a single ultrasonic transducer 46a that is facing a sound reflector 46b. Between the acoustic filter 44 and the droplet defining nozzle 32 are one or more contamination extraction nozzles 48.

An optional way of generating acoustic standing waves in a defined compartment is to design the transducer for a half wavelength standing wave (or a multiple thereof), whereafter the complete device is excited mechanically from an arbitrary coupling point. When the excitation frequency is subsequently tuned to match the transducer compartment, a standing wave is formed.

Ultrasonic standing wave manipulation offers a non-contact mode of particle handling. All types of particles can be affected by ultrasonic standing wave forces as long as they differ from the surrounding medium with regards to their acoustic properties. In particular, when the surrounding medium is liquid tin, it can be shown that solid tin oxide or tin intermetallics, which have proven to be the root cause of nozzle clogging, can be separated using ultrasonic standing wave forces.

A representation of the force applied to the particle is given by:

$$F_{ac} = -\frac{4}{3}\pi r^3 k E_{ac} A \sin(2kl) \quad \text{(equation 1)}$$

where r is the particle radius, k is the wave number, $E_{ac}$ is the time-averaged acoustic energy density, l is the distance from the nearest node and A represents the acoustic contrast factor. The acoustic contrast factor describes physical properties of the medium and the particle, and is given by:

$$A(\rho, \gamma) = \left(\frac{5\rho_p - 2\rho_f}{2\rho_p + 2\rho_f} - \frac{\rho_f c_f^2}{\rho_p c_p^2}\right) \quad \text{(equation 2)}$$

where the density of the medium and particles are denoted $\rho_f$ and $\rho_p$, respectively and the corresponding compressibilities $c_f$ and $c_p$. Force $F_\alpha$ is therefore dependent on the medium and particle densities and compressibilities/sound velocities. Because the densities of liquid tin and tin (II) and (IV) oxide are within 10% of each other, equation 2 can be approximated to:

$$A \approx \left(\frac{3}{4} - \frac{c_f^2}{c_p^2}\right) \quad \text{(equation 3)}$$

The force induced on particles in an acoustic standing wave field is the result of both the primary and secondary radiation forces, where the primary force originates from the standing wave and the secondary forces are due to sound waves scattered by the particles. The primary radiation force (PRF) is, in general, responsible for the strongest acoustic force exerted on the suspended particles in a standing wave field. Secondary forces are commonly orders of magnitudes smaller and are only influential at very short distances between particles, i.e., at very high particles densities.

FIG. 6 illustrates the effect of the acoustic standing wave field 72, in a tin medium inside conduit 30, on particles 34 such as those which cause nozzle blockages. It can be seen that the particles 34 align themselves with the nodes of the standing wave field 72. If the standing wave field is a half-wavelength across the conduit, then the particles can be aligned along a single node.

With this technique it is possible to collect and filter out in a contactless manner, i.e., manipulate particles, such that they do not enter the nozzle of a tin droplet generator. Collection may be effected by applying the acoustic force and directing the particles towards the wall.

FIG. 7 shows a practical application of the effect illustrated in FIG. 6. This is shown for illustration of the basic principles only, and the actual physical conduit shape/design and the arrangement and number of nozzles, inlets and their relative locations may differ considerably form shown, as may the desired standing wave formation and location/number of nodes. Also, depending on the particle/fuel characteristics, it may be that the contamination particles align with the anti-nodes of the standing wave, or they may even align with both nodes and anti-nodes, and the system (in particular the position of the contamination extraction nozzles) would need to be designed accordingly.

Shown is a conduit 30 of the fuel system, such as that between the nozzle 32 and reservoir 40. An acoustic filter 44 produces a half-wavelength standing wave 72 in the fuel, the standing wave 72 having its nodes at the sides. Contamination particles 34 become aligned with the nodes of the standing wave 72, and therefore become aligned along the sides of conduit 30. Beyond the acoustic filter 44, the conduit 30 divides into branches: one branch 80 to the nozzle 32 and one or more branches 82 to the contamination extraction nozzle 48. Therefore as the fuel flows along conduit 30, it is divided, with the contaminated fuel entering branches 82 and the filtered fuel entering branch 80. The contamination particles 34 are then removed via the contamination extraction nozzle(s) 48, which have a larger size than the droplet producing nozzle 32 and a larger size than the typical contamination particle.

This acoustic technique can be combined with techniques involving the application of an electric field and/or a magnetic field to drive and/or select particles so as to provide additional protection for the droplet generating nozzle.

FIG. 8 illustrates an alternative application of the principles disclosed herein. This shows an acoustic filter 44, which may be the same as that shown in FIG. 5, attached to the fuel refill line 50. The fuel refill line is the conduit through which the reservoir 40 is filled. Between the acoustic filter 44 and reservoir 40, is a refill contamination extraction nozzle 52. This system removes contamination from the fuel prior to it entering the reservoir 40.

It should be noted that the filtering arrangements of FIGS. 5 and 8 can be combined to provide a fuel system with an acoustic filter on its fuel refill line and an acoustic filter between the reservoir and droplet defining nozzle. Alternatively, or in addition, acoustic filters may be supplied at other locations in the fuel supply. Also, the concepts disclosed herein are applicable to fluid stream generators that provide a continuous stream of fuel, as well as those which produce a stream of droplets.

The ultrasonic sources may be piezo-ceramic elements that are either directly coupled into the fuel, or via a coupling layer. Applied frequencies may, for example, range from 1 to 10 MHz. This should not interfere with the driving frequency of the droplet generator nozzle, as this is typically two to three orders of magnitude less (tens of kHz). Besides, the filtering can take place at a different location, sufficiently far removed from where the droplet generator piezo-signal is applied, thereby preventing disturbance of the droplet generator acoustic signal.

The acoustic filter may comprise microchannel branch structures, formed using (robust) photolithographic patterning. Larger channels can be made by more robust methods (fibers). Typical dimensions of channels are in the order of a few hundred μm to 1 mm. Together with bulk material and piezo ceramic, a compact contactless acoustic tin filter can be made, with dimensions of about 1.5×1.5×5 $cm^3$. Typical flow through channels may range from 0.1 to 1 ml/s, which is three orders of magnitude larger than the fuel flow of current droplet generators.

A plurality of acoustic filters may be implemented in series and/or in parallel to improve filtration. Serial and/or parallel steps can be combined and integrated into a single filter.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms “wafer” or “die” herein may be considered as synonymous with the more general terms “substrate” or “target portion,” respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term “lens,” where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A fuel supply for a radiation source comprising:
a reservoir configured to retain a volume of fuel;
a conduit in fluid connection with the reservoir;
a nozzle, in fluid connection with the reservoir and the conduit, configured to direct a stream of the fuel along a trajectory towards a plasma formation location; and
a fuel contamination control arrangement comprising an acoustic filter configured to:
generate an acoustic standing wave in the fuel to separate contamination particles from the fuel while the fuel is flowing through the fuel supply; and
align the separated contamination particles along a side of the conduit,
wherein the acoustic filter is located between the reservoir and the nozzle.

2. The fuel supply of claim 1, wherein the fuel contamination control arrangement is configured to drive the contamination particles away from passing through the nozzle.

3. The fuel supply of claim 1, wherein the acoustic filter is located on a refill line to the reservoir.

4. The fuel supply of claim 1, wherein the acoustic filter is located on the reservoir or another reservoir upstream of the reservoir.

5. The fuel supply of claim 1, wherein:
the standing wave comprises a waveform having a maximum and a minimum; and
the acoustic filter is configured to align the contamination particles with the minimum of the waveform.

6. The fuel supply of claim 1, wherein: the fuel contamination control arrangement further comprises a contamination extraction nozzle configured to direct and remove the contamination particles; and
the standing wave comprises a waveform that directs the contamination particles towards the contamination extraction nozzle.

7. The fuel supply of claim 1, wherein the standing wave comprises a waveform having half a wavelength across the fuel being filtered.

8. The fuel supply of claim 1, wherein the acoustic filter comprises a piezo-ceramic element.

9. The fuel supply of claim 1, wherein the acoustic filter is coupled to the fuel via a coupling layer.

10. The fuel supply of claim 1, wherein the acoustic filter is configured to operate at a frequency within a range of 1 MHz to 10 MHz.

11. The fuel supply of claim 1, wherein an amplitude of the acoustic standing wave is in a direction transverse to a flow direction of the fuel.

12. An EUV radiation source comprising:
a fuel supply comprising:
a reservoir configured to retain a volume of fuel,
a conduit in fluid connection with the reservoir,
a nozzle, in fluid connection with the reservoir and the conduit, configured to direct a stream of the fuel along a trajectory towards a plasma formation location, and
a fuel contamination control arrangement comprising an acoustic filter configured to:
generate an acoustic standing wave in the fuel to separate contamination particles from the fuel while the fuel is flowing through the fuel supply, and
align the separated contamination particles along a side of the conduit,
wherein the acoustic filter is located between the reservoir and the nozzle; and
a laser configured to direct laser radiation at the stream of the fuel at the plasma formation location to generate a radiation generating plasma.

13. A lithographic apparatus comprising:
an EUV radiation source configured to generate an EUV radiation beam, the EUV radiation source comprising:
a fuel supply comprising:
a reservoir configured to retain a volume of fuel,
a conduit in fluid connection with the reservoir, a nozzle, in fluid connection with the reservoir, and the conduit, configured to direct a stream of the fuel along a trajectory towards a plasma formation location, and a fuel contamination control arrangement comprising an acoustic filter configured to:
generate an acoustic standing wave in the fuel to separate contamination particles from the fuel while the fuel is flowing through the fuel supply, and
align the separated contamination particles along a side of the conduit,
wherein the acoustic filter is located between the reservoir and the nozzle, and a laser configured to direct laser radiation at the stream of the fuel at the plasma formation location to generate the EUV radiation beam;

an illumination system configured to condition the EUV radiation beam;

a support configured to support a patterning device, the patterning device being capable of imparting the EUV radiation beam with a pattern in its cross-section to form a patterned radiation beam;

a substrate table configured to hold a substrate; and a projection system configured to project the patterned radiation beam onto a target portion of the substrate.

14. A method of controlling contamination in a fuel supply for a radiation source comprising:

placing a nozzle in fluid connection with a reservoir and a conduit of the fuel supply;

directing, using the nozzle, a stream of the fuel along a trajectory towards a plasma formation location;

placing an acoustic filter between the nozzle and the reservoir of the fuel supply;

generating, using the acoustic filter, an acoustic standing wave in a portion of a fuel comprised in the fuel supply while the fuel is flowing through the fuel supply;

aligning contamination particles in the portion of the fuel along a side of the conduit of the fuel supply; and directing the aligned contamination particles away from the nozzle of the fuel supply.

15. The method of claim 14, wherein the directing of the aligned contamination particles comprises directing the aligned contamination particles toward one or more contamination extraction nozzles of the fuel supply.

16. The method of claim 14, further comprising placing the acoustic filter between a reservoir and a refill line of the fuel supply.

17. The method of claim 14, further comprising placing the acoustic filter between a reservoir of the fuel supply and another reservoir of the fuel supply upstream of the reservoir.

18. The method of claim 14, wherein an amplitude of the acoustic standing wave is in a direction transverse to a flow direction of the fuel.

* * * * *